(12) United States Patent  (10) Patent No.: US 8,885,917 B2
Hsieh et al.  (45) Date of Patent: Nov. 11, 2014

(54) MASK PATTERN AND CORRECTING METHOD THEREOF

(75) Inventors: Te-Hsien Hsieh, Kaohsiung (TW); Ming-Jui Chen, Hsinchu (TW); Cheng-Te Wang, Hsinchu County (TW); Jing-Yi Lee, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 265 days.

(21) Appl. No.: 13/337,376

(22) Filed: Dec. 27, 2011

(65) Prior Publication Data

US 2013/0163850 A1   Jun. 27, 2013

(51) Int. Cl.
 *G06K 9/00* (2006.01)

(52) U.S. Cl.
 USPC .......................................................... 382/144

(58) Field of Classification Search
 CPC ................. G03F 7/70433; G03F 1/36; G06T 2207/30148
 USPC .......................................................... 382/144
 See application file for complete search history.

(56) References Cited

U.S. PATENT DOCUMENTS

| | | | |
|---|---|---|---|
| 6,033,811 A * | 3/2000 | Lee | 430/5 |
| 6,081,659 A * | 6/2000 | Garza et al. | 716/52 |
| 6,403,477 B1 * | 6/2002 | Tounai | 438/669 |
| 6,523,162 B1 * | 2/2003 | Agrawal et al. | 716/53 |
| 6,721,938 B2 * | 4/2004 | Pierrat et al. | 716/53 |
| 6,868,355 B2 * | 3/2005 | Ivanovic et al. | 702/94 |
| 7,046,715 B2 * | 5/2006 | Voutsas et al. | 372/109 |
| 7,353,145 B2 * | 4/2008 | Tanaka et al. | 703/2 |
| 7,617,475 B2 * | 11/2009 | Lin et al. | 716/54 |
| 7,650,587 B2 * | 1/2010 | Baum et al. | 716/54 |
| 7,984,390 B2 * | 7/2011 | Nakano et al. | 716/50 |
| 2009/0193385 A1 * | 7/2009 | Yang et al. | 716/19 |
| 2010/0175041 A1 | 7/2010 | Krasnoperova et al. | |

FOREIGN PATENT DOCUMENTS

CN 103048873 * 10/2011

OTHER PUBLICATIONS

English Translation of CN103048873. 2011.*
Christophe Pierrat; Frank A. J. M. Driessen; Geert Vandenberghe, "Full phase-shifting methodology for 65-nm node lithography" Jun. 26, 2003, Proc. SPIE 5040, Optical Microlithography XVI, (Jun. 26, 2003).*

\* cited by examiner

*Primary Examiner* — Utpal Shah
(74) *Attorney, Agent, or Firm* — WPAT, PC; Justin King

(57) ABSTRACT

A mask pattern and a correcting method thereof are provided. The correcting method includes the following steps. An original pattern having a first original contour and a second original contour is provided. The first original contour has a first original corner. The second original contour has a second original corner, which is near the first original corner. The first and second original corners are cut to form a cut pattern. An optical proximity correction (OPC) process is applied to the cut pattern to form the mask pattern.

11 Claims, 5 Drawing Sheets

MASK PATTERN AND CORRECTING METHOD THEREOF

BACKGROUND

1. Field of the Invention

The disclosure relates in general to a mask pattern and a correcting method thereof, and more particularly to a mask pattern and a correcting method thereof applied an optical proximity correction (OPC) process.

2. Description of the Related Art

Along with the development in semiconductor technology and micro electro mechanical systems (MEMS) technology, the precision of circuit is higher and higher and the critical dimension of an electric element is going to reduce. In the reduction of the element, the semiconductor manufacture technology is a key point for this target.

In the semiconductor manufacture technology, the precision of an optical lithography process makes a great influence on the critical dimension of the electric element. In the optical lithography process, a design pattern is formed on a mask, and an optical beam or an electronic beam is shot through the mask to project energy thereof on a photoresist layer. Then, a developed pattern of the photoresist layer is formed after applying a development process. However, due to the influence of an optical proximity effect (OPE), the developed pattern always does not match with the design pattern.

For eliminating the influence of the OPE, a designer must make a correction on the mask to reduce the difference between the developed pattern and the design pattern. However, some gaps of a mask pattern which is corrected are too small to conform to the requirement of the manufacture of the mask. This issue makes an obstruction on the reduction of the element. The design and correction of the mask pattern is became a bottleneck of the development in semiconductor technology and MEMS technology.

SUMMARY

The disclosure is directed to a mask pattern and a correcting method thereof, which perform cutting an original pattern before applying the optical proximity correction (OPC) process, to eliminate an optical proximity effect (OPE) and keep gaps of the mask pattern large to conform with the requirement of the manufacture of the mask.

According to a first aspect of the present disclosure, a correcting method of a mask pattern is provided. The correcting method includes the following steps. An original pattern having a first original contour and a second original contour is provided. The first original contour has a first original corner. The second original contour has a second original corner, which is near the first original corner. The first and second original corners are cut to form a cut pattern. An optical proximity correction (OPC) process is applied to the cut pattern to form the mask pattern.

According to a second aspect of the present disclosure, a mask pattern is provided. The mask pattern comprises a first mask contour and a second mask contour. The first mask contour has a first mask straight line, a second mask straight line and a first mask oblique line. The first mask straight line is substantially perpendicular to an extension direction of the first mask contour. The second mask straight line is substantially perpendicular to the extension direction of the first mask contour. Two ends of the first mask oblique line are respectively connected to the first mask straight line and the second mask straight line. The first mask oblique line and the second mask straight line form an acute angle. The second mask contour has a second mask oblique line. The second mask oblique line is substantially parallel to the first mask oblique line.

The above and other aspects of the disclosure will become better understood with regard to the following detailed description of the non-limiting embodiment(s). The following description is made with reference to the accompanying drawings.

DETAILED DESCRIPTION

First Embodiment

Figure 1:
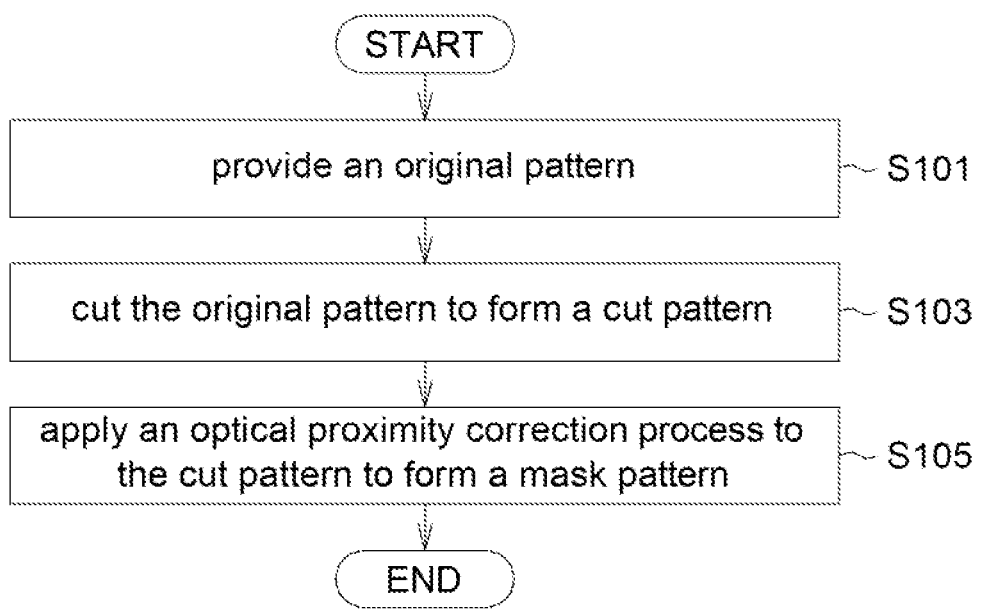
FIG. 1 shows a flowchart of a correcting method of a mask pattern according to a first embodiment.
Figure 2:
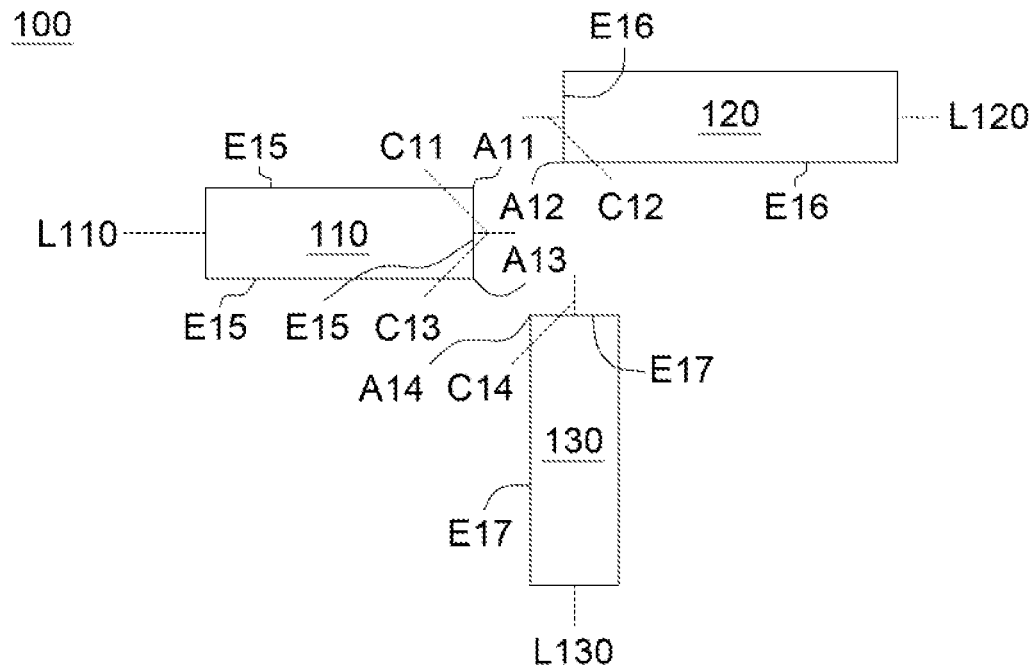
FIGS. 2 to 4 show the steps of the correcting method of the mask pattern according to the first embodiment.
Figure 3:
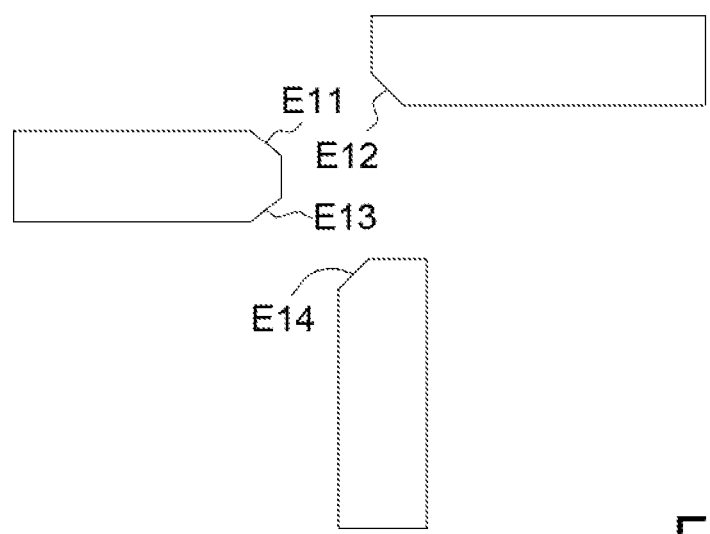
Figure 4:
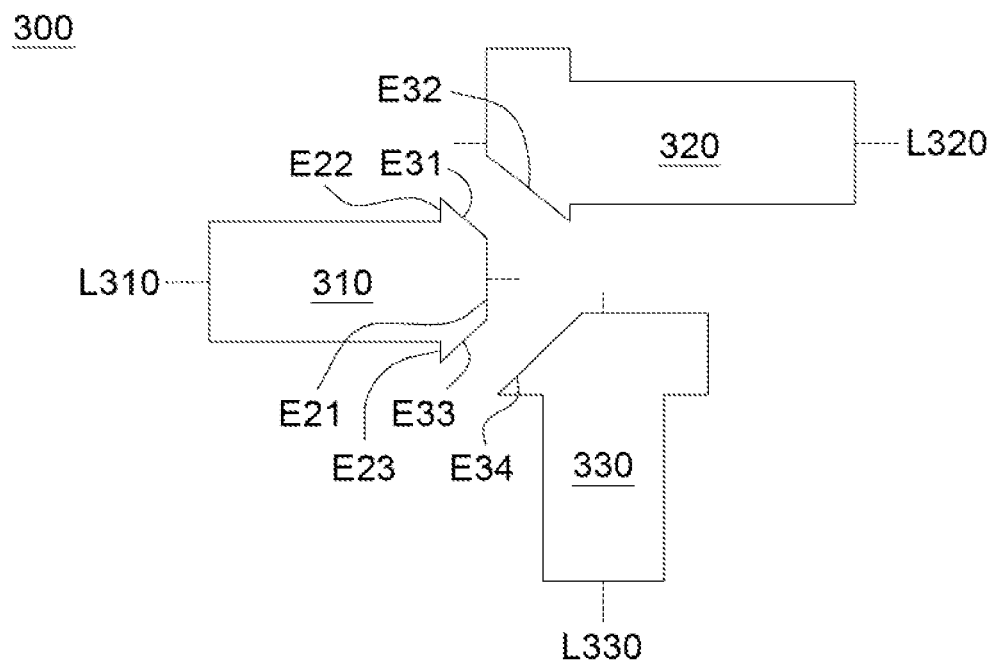

Please refer to FIGS. 1 to 4. FIG. 1 shows a flowchart of a correcting method of a mask pattern 300 according to a first embodiment. FIGS. 2 to 4 show the steps of the correcting method of the mask pattern according to the first embodiment. FIG. 2 shows an original pattern 100 at the beginning of the correcting method. FIG. 3 shows a cut pattern 200, which is performed after a cutting step. FIG. 4 shows the mask pattern 300, which is formed after applying an OPC process.

At first, in the step S101, referring to FIG. 2, the original pattern 100 is provided. The original pattern 100 has a first original contour 110, a second original contour 120 and a third original contour 130. The first original contour 110 has a first original corner A11 and a third original corner A13. The second original contour 120 has a second original corner A12. The third original contour 130 has a fourth original corner A14.

The first original contour 110 is substantially located between the second original contour 120 and the third original contour 130. An extension direction L110 of the first original contour 110 and an extension direction L120 of the second original contour 120 are substantially parallel with each other. The extension direction L110 of the first original contour 110 and an extension direction L130 of the third original contour 130 are substantially perpendicular with each other.

Regarding the first original contour 110 and the second original contour 120, the first original corner A11 is near the second original corner A12. The first original corner A11 and the second original corner A12 are the nearest part of the first original contour 110 and the second original contour 120. Base on a result of a research, if the first original corner A11 and the second original corner A12 are too close, the mask pattern 300 (shown in FIG. 4) might has some connecting part. The connecting part occurring in the mask pattern 300 does not conform to the requirement of the manufacture of a mask and cannot be manufactured.

Next, in the step S103, referring to FIGS. 2 to 3, the original pattern 100 is cut to form the cut pattern 300. In the present embodiment, the first original corner A11 and the second original corner A12, which are the nearest part of the first original contour 110 and the second original contour 120, are cut. The third original corner A13 and the fourth original corner A14, which are the nearest part of the first original contour 110 and the third original contour 130, are cut.

In this step, two cutting directions C11, C12, where the first original corner A11 and the second original corner A12 are cut respectively, are substantially parallel with each other, and therefore two parallel cut oblique lines E11, E12 are formed. Two cutting directions C13, C14, where the third original corner A13 and the fourth original corner A14 are cut respectively, are substantially parallel with each other, and therefore two parallel cut oblique lines E13, E14 are formed.

Regarding the cutting directions, referring to FIG. 2, the cutting directions C11, C13 are respectively tilted toward the extension direction L110 of the first original contour 110 at 45 degree substantially. The cutting direction C12 is tilted toward the extension direction L120 of the second original contour 120 at 45 degree substantially. The cutting direction C14 is tilted toward the extension direction L130 of the second original contour 130 at 45 degree substantially.

Moreover, referring to FIG. 2, because the cutting directions C11, C13 are respectively tilted toward the extension L110 of the first original contour 110 at 45 degree substantially, the cutting direction C11 and the cutting direction C13 are substantially perpendicular to each other.

Figure 5:
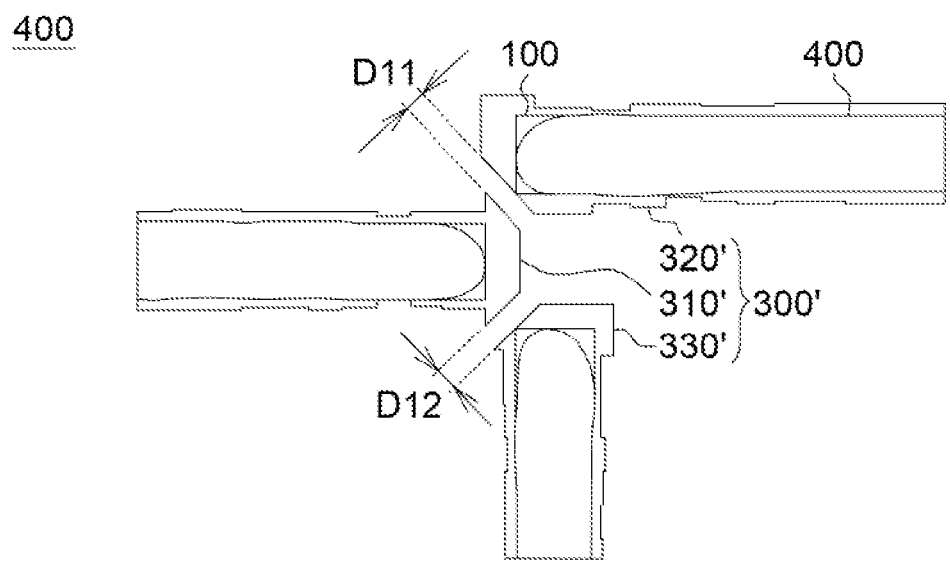
FIG. 5 shows a computerized diagram outputted from the optical proximity correction which is model based in the first embodiment.

Regarding the amount of cutting, referring to FIG. 2, the first original contour 110 has three original straight lines E15 connected to the first original corner A11 and the third original corner A13. The second original contour 120 has two original straight lines E16 connected to the second original corner A12. The third original contour 130 has two original straight lines E17 connected to the fourth original corner A14. Less than 50 percentage of each of the original straight lines E15, E16, E17 is cut. Therefore, even if two ends of each of the original straight lines E15, E16, E17 is cut, at least part of the original straight lines E15, E16, E17 can be remained so that a developed pattern 400 (as shown in FIG. 5) can approximate to the original pattern 100.

Afterwards, in the step S105, referring to FIGS. 3 to 4, the cut pattern 200 is applied the OPC process to form the mask pattern 300. The mask pattern 300 includes a first mask contour 310, a second mask contour 320 and a third mask contour 330, which are formed from the first original contour 110, the second original contour 120 and the third original contour 130 (shown in FIG. 2) respectively. Similar to the first original contour 110 and the second original contour 120, the extension directions L310, L320 of the first mask contour 310 and the second mask contour 320 are substantially parallel to each other. Similar to the first original contour 110 and the third original contour 130, the extension directions L310, L330 of the first mask contour 310 and the third mask contour 330 are substantially perpendicular to each other.

After performing the steps of cutting and applying the OPC process, the gaps between the first mask contour 310, the second mask contour 320 and the third mask contour 330 are kept large.

Regarding the first mask contour 310, one end of the first mask contour 310 is formed as a substantially symmetrical trapezoid structure. Furthermore, the first mask contour 310 has a first mask straight line E21, a second mask straight line E21, a second mask straight line E22, a third mask straight line E23, a first mask oblique line E31 and a third mask oblique line E33. The second mask straight line E22, the first mask oblique line E31, the first mask straight line E21, the third mask oblique line E33 and the third mask straight line E23 are connected sequentially.

The first mask straight line E21, the second straight line E22 and the third straight line E23 are substantially perpendicular to the extension direction L310 of the first mask contour 310. The first mask oblique line E31 is tilted toward the extension direction L310 of the first mask contour 310 at a degree, such as 45 degree. The third mask oblique line E33 is tilted toward the extension direction L310 of the first mask contour 310 at a degree, such as 45 degree. Because the first mask oblique line E31 and the third mask oblique line E33 are tilted toward the extension direction L310 of the first mask contour 310 at 45 degree, the first mask oblique line E31 and the third mask oblique are substantially perpendicular to each other.

Furthermore, the first mask oblique line E31 and the second mask straight line E22 form an acute angle, such as 45 degree. The third mask oblique line E33 and the third mask straight line E23 form another acute angle, such as 45 degree.

Regarding the second mask contour 320, the second mask contour 320 has a second mask oblique line E32. The second mask oblique line E32 is substantially parallel to the first mask oblique line E31 and a gap therebetween is kept large.

Regarding the third mask contour 330, the third mask contour 330 has a fourth mask oblique line E34. The fourth mask oblique line E34 is substantially parallel to the third mask oblique line E33 and a gap therebetween is kept large.

Please referring to FIG. 5, FIG. 5 shows a computerized diagram outputted from the optical proximity correction which is model based in the first embodiment. In the model based OPC process, the developed pattern 400 is predicted according to an accurate numerical model, and accordingly the mask pattern 300' is approximately figured.

Referring to FIG. 5, in the mask pattern 300', a gap D11 between a first mask contour 310' and a second mask contour 320' is 14.7145 nm. A gap D12 between the first mask contour 310' and a third mask contour 330' is 14.3795 nm. The gaps in the mask pattern 300' are kept large. Moreover, referring to FIG. 5, after the mask pattern 300' is applied a development process, the developed pattern 400 thereof approximates to the original pattern 100 and the OPE is eliminated.

Second Embodiment

Figure 6:
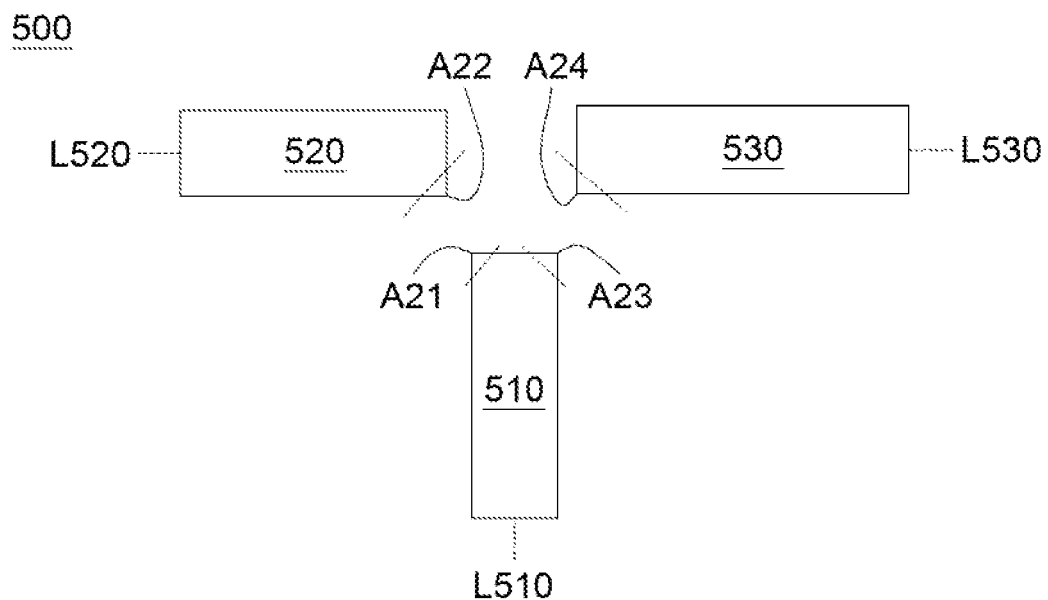
FIGS. 6 to 8 show the steps of a correcting method of a mask pattern according to a second embodiment.
Figure 7:
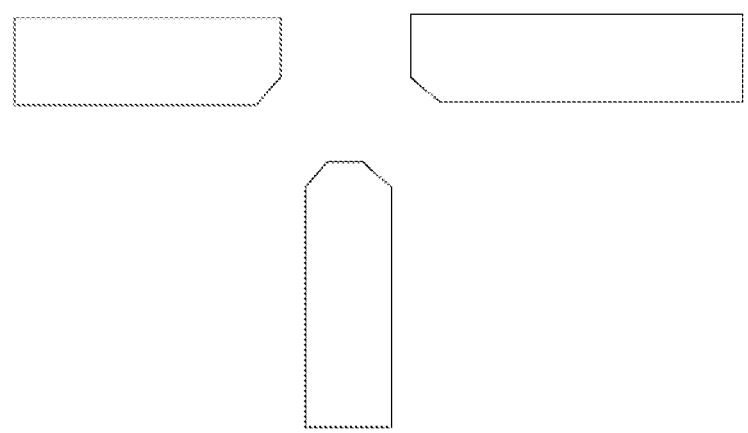
Figure 8:
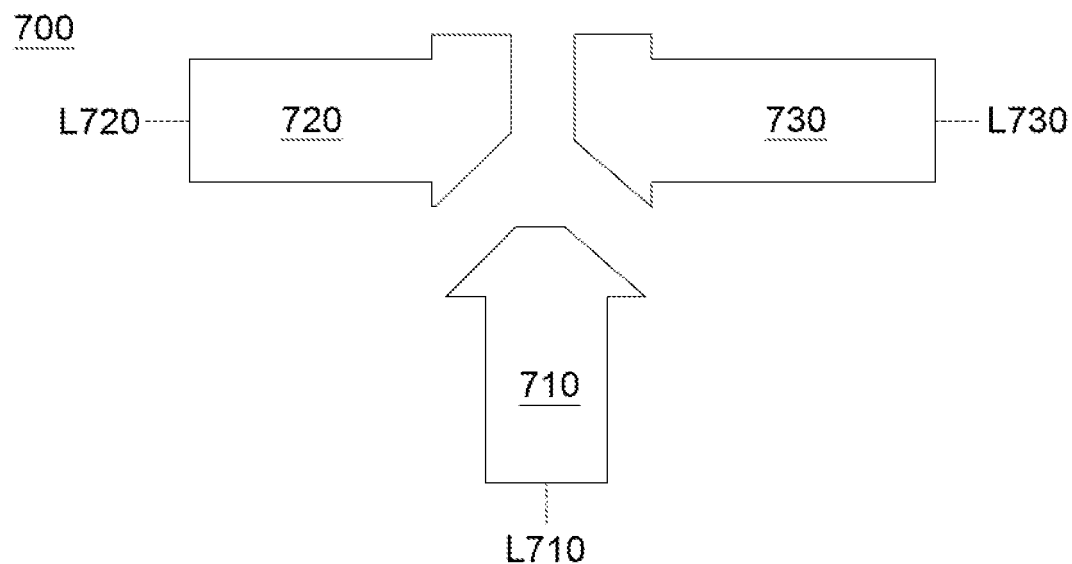

Please referring to FIGS. 6 to 8, FIGS. 6 to 8 show the steps of a correcting method of a mask pattern according to a second embodiment. FIG. 6 shows an original pattern 500 at the beginning of the correcting method. FIG. 7 shows a cut pattern 600, which is performed after a cutting step. FIG. 8 shows a mask pattern 700, which is performed after applying the OPC process. The mask pattern 500 and correcting method thereof of the present embodiment of the invention differ with the mask pattern 300 and correcting method thereof of the first embodiment in the relationship between the contours. Other similarities between the two embodiments are not repeated here.

Referring to FIG. 6, an extension direction L510 of a first original contour 510 and an extension direction L520 of a second original contour 520 are substantially perpendicular. The extension direction L510 of the first original contour 510 and an extension direction L530 of a third original contour 530 are substantially perpendicular.

Referring to FIGS. 6 to 7, the first original corner A21 and the second original corner A22, which are the nearest part of the first original contour 510 and the second original contour 520, are cut. The third original corner A23 and the fourth original corner A24, which are the nearest part of the first original contour 510 and the third original contour 530, are cut.

Referring to FIGS. 7 to 8, after the cut pattern 600 is applied the OPC process, the mask pattern 700 is formed.

Similar to the first original contour 510 and the second original contour 520, two extension directions L710, L720 of the first mask contour 710 and the second mask contour 720 are substantially parallel to each other. Similar to the first original contour 510 and the third original contour 530, two extension directions L710, L730 of the first mask contour 710 and the third mask contour 730 are substantially perpendicular to each other.

After performing the steps of cutting and applying the OPC process, the gaps between the first mask contour 710, the second mask contour 720 and the third mask contour 730 of the mask pattern 700 are kept large.

Figure 9:
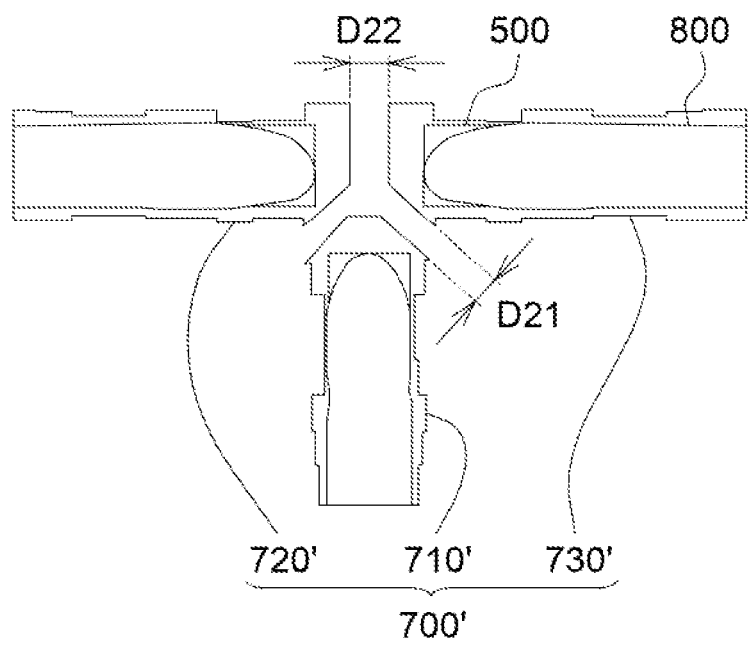
FIG. 9 shows a computerized diagram outputted from the optical proximity correction which is model based in the second embodiment.

Please referring to FIG. 9, FIG. 9 shows a computerized diagram outputted from the optical proximity correction which is model based in the second embodiment. A gap D21 between a first mask contour 710' and a third mask contour 730' is 14.4033 nm. A gap D22 between the second mask contour 720' and a third mask contour 730' is 20.0000 nm. The gaps in the mask pattern 700' are kept large. Moreover, referring to FIG. 9, after the mask pattern 700' is applied a development process, the developed pattern 800 thereof approximates to the original pattern 500 and the OPE is eliminated.

While the disclosure has been described by way of example and in terms of the exemplary preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A correcting method of a mask pattern, comprising:
   providing an original pattern having a first original contour and a second original contour, the first original contour having a first original corner and the second original contour having a second original corner, which is near the first original corner;
   cutting the first and second original corners to form a cut pattern; and
   applying an optical proximity correction (OPC) process to the cut pattern to form the mask pattern;
   wherein the first original contour further has a third original corner, the original pattern further has a third original contour, the first original contour is located between the second original contour and the third original contour, the third original contour has a fourth original corner, the third original corner is near the fourth original corner, and in the step of forming the cut pattern, the third original corner and the fourth original corner are cut, and two cutting directions of the first and the third original corners are substantially perpendicular to each other.

2. The correcting method according to claim 1, wherein in the step of forming the cut pattern, two cutting directions where the first and the second original corners are cut are substantially parallel with each other.

3. The correcting method according to claim 1, wherein in the step of forming the cut pattern, a cutting direction where the first original corner is cut is tilted toward an extension direction of the first original contour at 45 degree substantially.

4. The correcting method according to claim 1, wherein the first original contour has an original straight line, the original straight line is connected to the first original corner, and in the step of forming the cut pattern, less than 50 percentage of the original straight line is cut.

5. The correcting method according to claim 1, wherein in the step of providing the original pattern, two extension directions of the first and the second original contours are substantially parallel to each other.

6. The correcting method according to claim 1, wherein in the step of providing the original pattern, two extension directions of the first and the second original contours are substantially perpendicular to each other.

7. A mask pattern, comprising:
   a first mask contour, having:
      a first mask straight line, substantially perpendicular to an extension direction of the first mask contour;
      a second mask straight line, substantially perpendicular to the extension direction of the first mask contour; and
      a first mask oblique line, two ends of the first mask oblique line respectively connected to the first mask straight line and the second mask straight line, the first mask oblique line and the second mask straight line forming an acute angle; and
   a second mask contour, having:
      a second mask oblique line, substantially parallel to the first mask oblique line
   wherein the first mask contour further has a third mask oblique line, two ends of the first mask straight line are respectively connected to the first mask oblique line and the third mask oblique line, and the mask pattern further includes:
   a third mask contour, having a fourth mask oblique line, which is substantially parallel to the third oblique line.

8. The mask pattern according to claim 7, wherein the acute angle is substantially 45 degree.

9. The mask pattern according to claim 7, wherein the first mask oblique line is substantially perpendicular to the third mask oblique line.

10. The mask pattern according to claim 7, wherein two extension directions of the first and the second mask contours are substantially parallel to each other.

11. The mask pattern according to claim 7, wherein two extension directions of the first and the second mask contours are substantially perpendicular to each other.

* * * * *